United States Patent
Qi et al.

(10) Patent No.: US 8,084,765 B2
(45) Date of Patent: Dec. 27, 2011

(54) ELECTRONIC DEVICE HAVING A DIELECTRIC LAYER

(75) Inventors: Yu Qi, Oakville (CA); Yiliang Wu, Mississauga (CA); Yuning Li, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 1160 days.

(21) Appl. No.: 11/745,308

(22) Filed: May 7, 2007

(65) Prior Publication Data
US 2008/0277724 A1   Nov. 13, 2008

(51) Int. Cl.
H01L 27/01 (2006.01)
B32B 9/04 (2006.01)
C07F 7/04 (2006.01)
C08F 12/24 (2006.01)
C08G 12/14 (2006.01)
C08K 5/24 (2006.01)

(52) U.S. Cl. .......... 257/40; 257/347; 257/410; 428/447; 524/261; 528/268

(58) Field of Classification Search ............ 257/40
See application file for complete search history.

(56) References Cited

U.S. PATENT DOCUMENTS

| | | | |
|---|---|---|---|
| 4,480,009 A * | 10/1984 | Berger | 428/447 |
| 5,726,271 A * | 3/1998 | Furukawa et al. | 528/29 |
| 6,015,869 A * | 1/2000 | Grate et al. | 528/15 |
| 6,031,012 A * | 2/2000 | Nakanishi et al. | 521/111 |
| 6,498,010 B1 * | 12/2002 | Fitzgerald et al. | 435/6 |
| 6,602,551 B2 * | 8/2003 | Kerboua et al. | 427/387 |
| 6,660,230 B2 * | 12/2003 | McGill et al. | 422/82.13 |
| 6,773,809 B1 * | 8/2004 | Itoh et al. | 428/355 R |
| 6,780,517 B2 * | 8/2004 | Chen et al. | 428/447 |
| 6,872,454 B2 * | 3/2005 | Newberth et al. | 428/446 |
| 6,991,887 B1 * | 1/2006 | Grate et al. | 430/270.1 |
| 7,005,674 B2 * | 2/2006 | Lee et al. | 257/40 |
| 7,034,089 B2 * | 4/2006 | Herr et al. | 525/479 |
| 7,422,831 B2 * | 9/2008 | Yu | 430/69 |
| 7,553,706 B2 * | 6/2009 | Liu et al. | 438/149 |
| 7,655,738 B2 * | 2/2010 | Keller et al. | 525/477 |
| 7,678,864 B2 * | 3/2010 | Lens et al. | 525/439 |
| 7,737,291 B2 * | 6/2010 | Osasawara et al. | 556/401 |
| 2003/0049465 A1 * | 3/2003 | Kerboua et al. | 428/447 |
| 2004/0033700 A1 * | 2/2004 | Gronbeck et al. | 438/781 |
| 2004/0122186 A1 * | 6/2004 | Herr et al. | 525/476 |
| 2004/0137241 A1 * | 7/2004 | Lin et al. | 428/447 |
| 2004/0213971 A1 * | 10/2004 | Colburn et al. | 428/209 |
| 2004/0242829 A1 * | 12/2004 | Sugo | 528/31 |
| 2005/0017311 A1 * | 1/2005 | Ong et al. | 257/400 |
| 2005/0090015 A1 * | 4/2005 | Hartmann-Thompson | 436/166 |
| 2005/0209400 A1 * | 9/2005 | Tsumura et al. | 525/100 |
| 2005/0211978 A1 * | 9/2005 | Bu et al. | 257/40 |
| 2006/0097249 A1 * | 5/2006 | Kim et al. | 257/40 |

(Continued)

OTHER PUBLICATIONS

Mathias et al. Macromolecules 1993, 26, 4070-4071.*

(Continued)

*Primary Examiner* — Mark Eashoo
*Assistant Examiner* — Michael Salvitti
(74) *Attorney, Agent, or Firm* — Fay Sharpe LLP

(57) ABSTRACT

An electronic device, such as a thin film transistor, is disclosed having a dielectric layer formed from a composition comprising a compound having at least one phenol group and at least one group containing comprising silicon. The resulting dielectric layer has good electrical properties.

8 Claims, 2 Drawing Sheets

U.S. PATENT DOCUMENTS

| | | | |
|---|---|---|---|
| 2006/0204742 A1* | 9/2006 | Gronbeck et al. | 428/318.4 |
| 2006/0214159 A1* | 9/2006 | Nakayama et al. | 257/40 |
| 2006/0231908 A1* | 10/2006 | Liu et al. | 257/410 |
| 2006/0234430 A1* | 10/2006 | Liu et al. | 438/149 |
| 2006/0243947 A1* | 11/2006 | Tsumura et al. | 252/299.01 |
| 2007/0043195 A1* | 2/2007 | McGill et al. | 528/35 |
| 2007/0059623 A1* | 3/2007 | Yu | 430/69 |
| 2007/0081830 A1* | 4/2007 | Bender et al. | 399/159 |
| 2007/0096079 A1* | 5/2007 | Nakayama et al. | 257/40 |
| 2007/0145453 A1* | 6/2007 | Wu et al. | 257/310 |
| 2007/0207326 A1* | 9/2007 | Mizuno et al. | 428/447 |
| 2007/0232821 A1* | 10/2007 | Ogasawara et al. | 556/401 |
| 2007/0268556 A1* | 11/2007 | Chopra et al. | 359/296 |
| 2007/0269653 A1* | 11/2007 | Kanamori et al. | 428/336 |
| 2008/0153994 A1* | 6/2008 | Lens et al. | 525/446 |
| 2008/0277724 A1* | 11/2008 | Qi et al. | 257/347 |
| 2008/0306294 A1* | 12/2008 | Lens et al. | 556/449 |

OTHER PUBLICATIONS

Barciniec "Hydrosilation" Chapter 6 Hydrosilyation Polymerization (DOI 10.1007/978-1-4020-8172-9_6) 2009. pp. 191-214.*

* cited by examiner

ELECTRONIC DEVICE HAVING A DIELECTRIC LAYER

BACKGROUND

The present disclosure relates, in various embodiments, to compositions suitable for use in electronic devices, such as thin film transistors ("TFT"s). The present disclosure also relates to layers produced using such compositions and electronic devices containing such layers.

Thin film transistors (TFTs) are fundamental components in modern-age electronics including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of a supporting substrate, three electrically conductive electrodes (gate, source and drain electrodes), a channel semiconductor layer, and an electrically insulating gate dielectric layer separating the gate electrode from the semiconductor. The channel semiconductor is in turn in contact with the source and drain electrodes. Recently, there has been an increased interest in plastic thin film transistors which can potentially be fabricated using solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To enable the use of these solution-based processes in fabricating thin film transistor circuits, solution processable materials are therefore required.

Most of the current materials research and development activities for plastic thin film transistors has been devoted to semiconductor materials, particularly solution-processable organic and polymer semiconductors. Other material components such as solution processable dielectric materials have not received much attention.

For plastic thin film transistor applications, it is desirable to have all the materials be solution processable. It is also highly advantageous that the materials be fabricated on plastic substrates at a temperature of less than about 200° C., and particularly less than about 150° C. The use of plastic substrates, together with flexible organic or polymer transistor components can transform the traditional thin film transistor circuits on rigid substrates into mechanically more durable and structurally flexible plastic thin film transistor circuit designs. Flexible thin film transistor circuits will be useful in fabricating mechanically robust and flexible electronic devices.

Other than solution processable semiconductor and conductor components, solution processable dielectric materials are critical components for the fabrication of plastic thin film transistor circuits for use in plastic electronics, particularly flexible large-area plastic electronics devices.

The dielectric layer should be free of pinholes and possess low surface roughness (or high surface smoothness), low leakage current, a high dielectric constant, a high breakdown voltage, adhere well to the gate electrode, be stable in solution at room temperature, and offer other functionality. It should also be compatible with semiconductor materials because the interface between the dielectric layer and the organic semiconductor layer critically affects the performance of the TFT. Additionally, for flexible integrated circuits on plastic substrates, the dielectric layer should be readily curable at elevated temperatures that would not adversely affect the dimensional stability of the plastic substrates, i.e., generally less than about 200° C., including less than about 150° C.

A wide variety of organic and polymer materials, including polyimides, poly(vinylphenol), poly(methyl methacrylate), polyvinylalcohol, poly(perfluoroethylene-co-butenyl vinyl ether), and benzocyclobutene have been studied for use in dielectric layers. These materials, however, do not generally meet all the economic and/or functional requirements of low-cost thin film transistors.

Therefore, it is desirable to provide a dielectric material composition that is solution processable and which composition can be used in fabricating the gate dielectric layers of thin film transistors. It is further desirable to provide a dielectric material that will permit easy fabrication of a gate dielectric layer for thin film transistors by solution processes, that is pinhole free, has a high dielectric constant, and exhibits electrical and mechanical properties that meet the device physical and performance requirements. It is also desirable to provide a material for fabricating the dielectric layer for thin film transistors that can be processed at a temperature compatible with plastic substrate materials to enable fabrication of flexible thin film transistor circuits on plastic films or sheets.

INCORPORATION BY REFERENCE

Disclosed in U.S. patent application Ser. No. 11/318,044, filed Dec. 23, 2005, the disclosure of which is hereby incorporated fully by reference, is a thin film transistor having a dielectric layer comprising a polysiloxane or polysilsesquioxane polymer and inorganic particles.

Additionally disclosed in U.S. patent application Ser. No. 11/104,728, filed Apr. 13, 2005, and 11/276,634, filed Mar. 8, 2006, now U.S. Pat. No. 7,553,706 the disclosures of which are hereby incorporated fully by reference, is a thin film transistor having a dual-layer dielectric layer, one layer comprising a polysiloxane or polysilsesquioxane polymer.

BRIEF DESCRIPTION

The present disclosure is directed, in various embodiments, to an electronic device having a dielectric layer. The dielectric layer is prepared from a composition comprising a compound having at least one phenol group and at least one group comprising silicon. In further embodiments, the dielectric layer is crosslinked. The composition may further comprise poly(vinylphenol) or a melamine-formaldehyde resin.

In other embodiments, the compound is a bisphenol A having at least one polyhedral oligomeric silsesquioxane pendant group In still further embodiments, the compound is POSS-BPA-1 or POSS-BPA-2 having the chemical structures shown below:

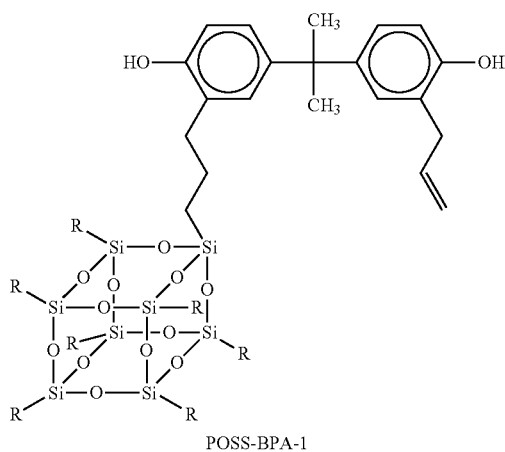

POSS-BPA-1

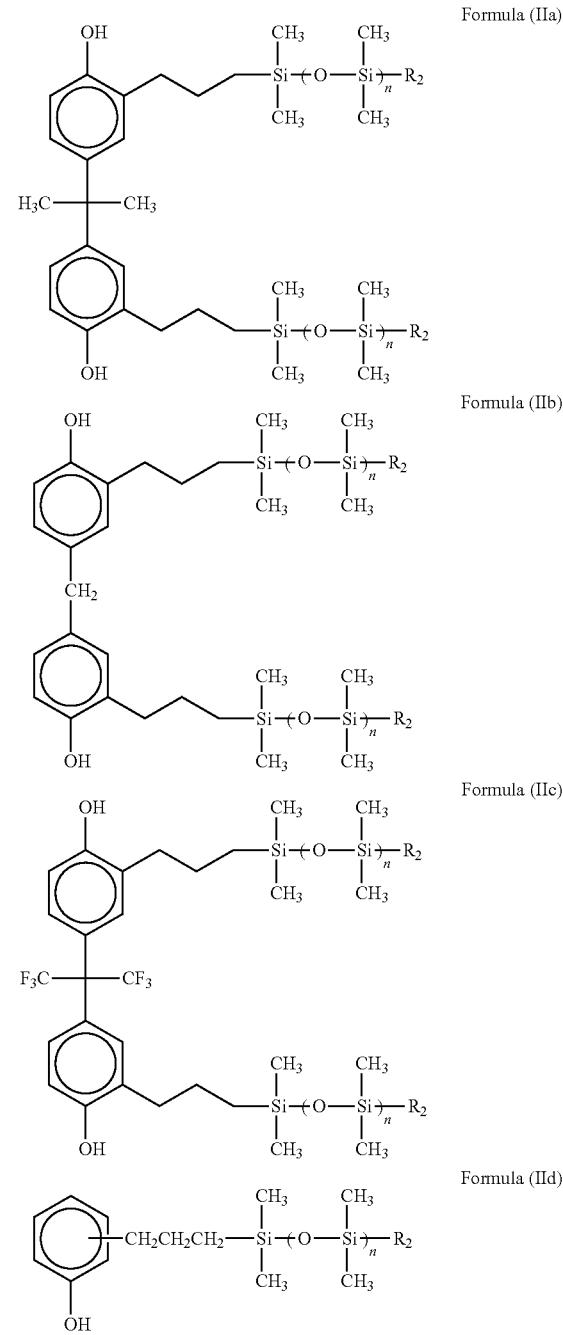

Formula (IIa), (IIb), (IIc), (IId)

POSS-BPA-2 wherein R is selected from the group consisting of alkyl, cycloalkyl, phenyl, aryl, alkoxy, halogen, and hydrogen.

In still other embodiments, the compound has the structure of Formula (I):

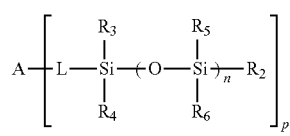

Formula (I)

wherein A contains at least one phenol group; L is a divalent linkage; $R_2$, $R_3$, $R_4$, $R_5$, and $R_6$ are independently selected from the group consisting of hydrogen and alkyl; n is an integer; and p is an integer from 1 to 10.

In further embodiments, the compound has one of the four following structures:

wherein $R_2$ is hydrogen or alkyl; and n is an integer from 0 to 10,000.

In other embodiments, the compound comprises Formula (III) having the structure shown below:

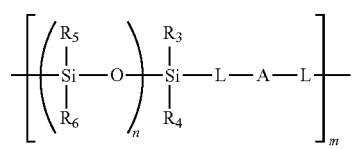

Formula (III)

wherein A contains at least one phenol group; L is a divalent linkage; $R_3$, $R_4$, $R_5$, and $R_6$ are independently selected from the group consisting of hydrogen and alkyl; n is an integer; and m is the degree of polymerization.

In yet other embodiments, the compound comprises Formula (IV) having the structure shown below:

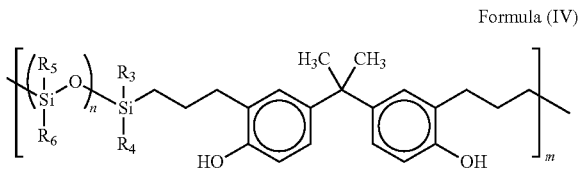

Formula (IV)

wherein $R_3$, $R_4$, $R_5$, and $R_6$ are independently selected from the group consisting of hydrogen and alkyl; n is an integer; and m is the degree of polymerization.

The composition may further comprise an acid catalyst. In specific embodiments, the acid catalyst is p-toluenesulfonic acid.

Also disclosed is a thin film transistor comprising a dielectric layer prepared from a composition comprising poly(vinylphenol), a melamine-formaldehyde resin, and a compound having at least one phenol group and at least one group comprising silicon.

In specific embodiments, the poly(vinylphenol) is present in the dielectric layer in an amount of from about 1 to about 90 weight percent, based on the weight of the dielectric layer. The poly(vinylphenol) may also be present in the amount of from about 20 to about 60 weight percent or from about 30 to about 50 weight percent. In further specific embodiments, the poly(vinylphenol) is present in the dielectric layer in an amount of from about 40 to about 45 weight percent, based on the weight of the dielectric layer.

In other specific embodiments, the melamine-formaldehyde resin is present in the dielectric layer in an amount of from about 1 to about 90 weight percent, based on the weight of the dielectric layer. The melamine-formaldehyde resin may also be present in the amount of from about 20 to about 60 weight percent or from about 30 to about 50 weight percent. In further specific embodiments, the melamine-formaldehyde resin is present in the dielectric layer in an amount of from about 40 to about 45 weight percent, based on the weight of the dielectric layer.

In further specific embodiments, the compound having at least one phenol group and at least one group comprising silicon is present in the dielectric layer in an amount of from about 0.1 to about 20 weight percent, based on the weight of the dielectric layer. The compound may also be present in the amount of from about 0.5 to about 15 weight percent or from about 1 to about 10 weight percent. In other embodiments, the compound is present in the amount of from about 10 to about 20 weight percent.

In embodiments, the dielectric layer may have a dielectric constant greater than 3.5.

In other embodiments, the dielectric layer may have an advancing surface water contact angle greater than 85 degrees.

In specific embodiments, the thin film transistor may have a mobility of greater than 0.01 cm2/V·sec and a current on/off ratio of greater than 104.

Also disclosed is a thin film transistor comprising a substrate, three electrodes, a semiconductor layer, and a dielectric layer, wherein the dielectric layer is formed from a compound comprising at least one phenol group and at least one group comprising silicon.

Also disclosed is a composition for preparing a dielectric layer, comprising a compound having at least one phenol group and at least one group comprising silicon. In further embodiments, the composition may further comprise poly(vinylphenol). In other embodiments, the composition may further comprise a melamine-formaldehyde resin. In still further embodiments, the composition may further comprise an acid catalyst.

Processes for fabricating an electronic device having the dielectric layer described above are also disclosed. In particular embodiments, the electronic device is a thin film transistor.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
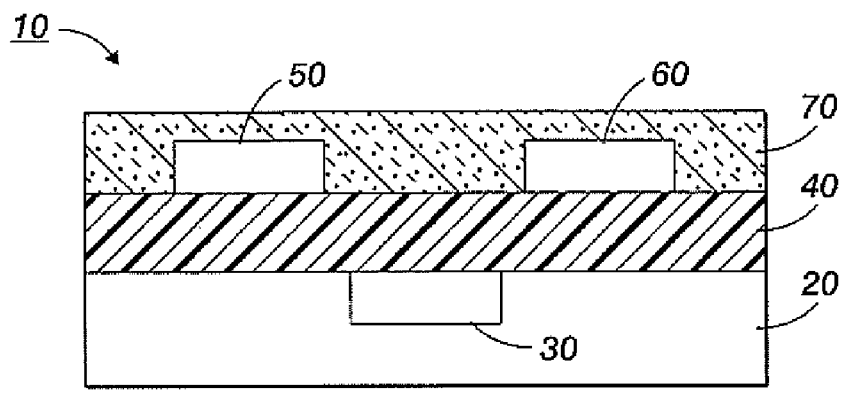
FIG. 1 is a first exemplary embodiment of a TFT having a dielectric layer according to the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first TFT configuration. This TFT has a bottom-gate configuration. The TFT 10 comprises a substrate 20 in contact with the gate electrode 30 and a dielectric layer 40. Although here the gate electrode 30 is depicted within the substrate 20, this is not required; the key is that the dielectric layer 40 separates the gate electrode 30 from the source electrode 50, drain electrode 60, and the semiconductor layer 70. The source electrode 50 contacts the semiconductor layer 70. The drain electrode 60 also contacts the semiconductor layer 70.

Figure 2:
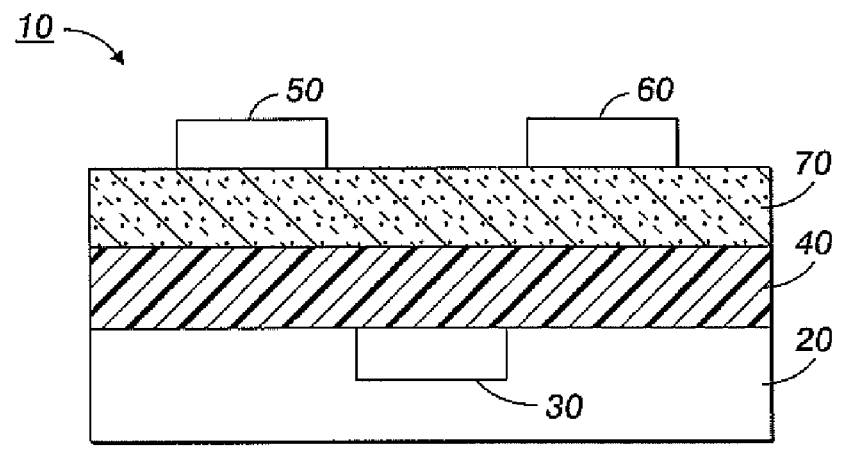
FIG. 2 is a second exemplary embodiment of a TFT having a dielectric layer according to the present disclosure.

FIG. 2 illustrates a second TFT configuration. The TFT 10 comprises a substrate 20 in contact with the gate electrode 30 and a dielectric layer 40. The semiconductor layer 70 is placed on top of the dielectric layer 40 and separates it from the source and drain electrodes 50 and 60.

Figure 3:
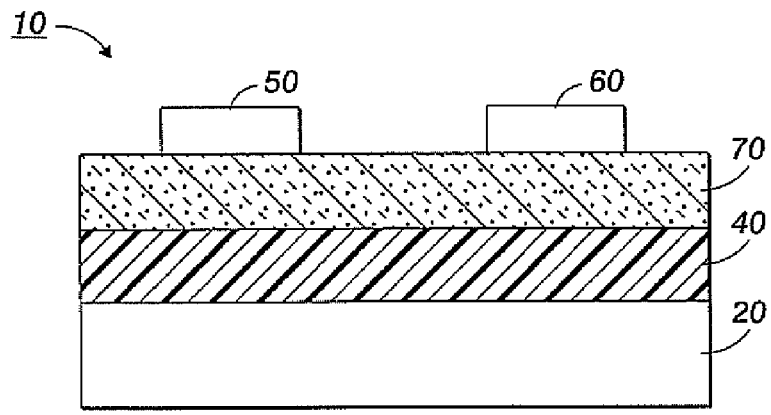
FIG. 3 is a third exemplary embodiment of a TFT having a dielectric layer according to the present disclosure.

FIG. 3 illustrates a third TFT configuration. The TFT 10 comprises a substrate 20 which also acts as the gate electrode and is in contact with a dielectric layer 40. The semiconductor layer 70 is placed on top of the dielectric layer 40 and separates it from the source and drain electrodes 50 and 60.

Figure 4:
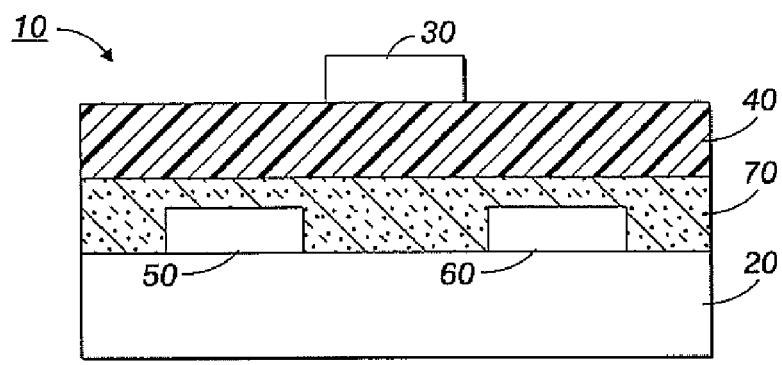
FIG. 4 is a fourth exemplary embodiment of a TFT having a dielectric layer according to the present disclosure.

FIG. 4 illustrates a fourth TFT configuration. This TFT has a top-gate configuration. The TFT 10 comprises a substrate 20 in contact with the source electrode 50, drain electrode 60, and the semiconductor layer 70. The dielectric layer 40 is on top of the semiconductor layer 70. The gate electrode 30 is on top of the dielectric layer 40 and does not contact the semiconductor layer 70.

The dielectric layer of the present disclosure is formed from a composition comprising a compound having at least one phenol group and at least one group containing silicon. In particular embodiments, the silicon-containing group also contains oxygen.

In some embodiments, the compound is a bisphenolic compound (i.e. having two phenol groups). In other embodiments, the compound is a bisphenol A having at least one group containing silicon. In other particular embodiments, the side group containing silicon is a polyhedral oligomeric silsesquioxane (POSS).

In other specific embodiments, the compound is a bisphenol A compound having at least one POSS group as a side group. Two exemplary embodiments of the compound are shown below:

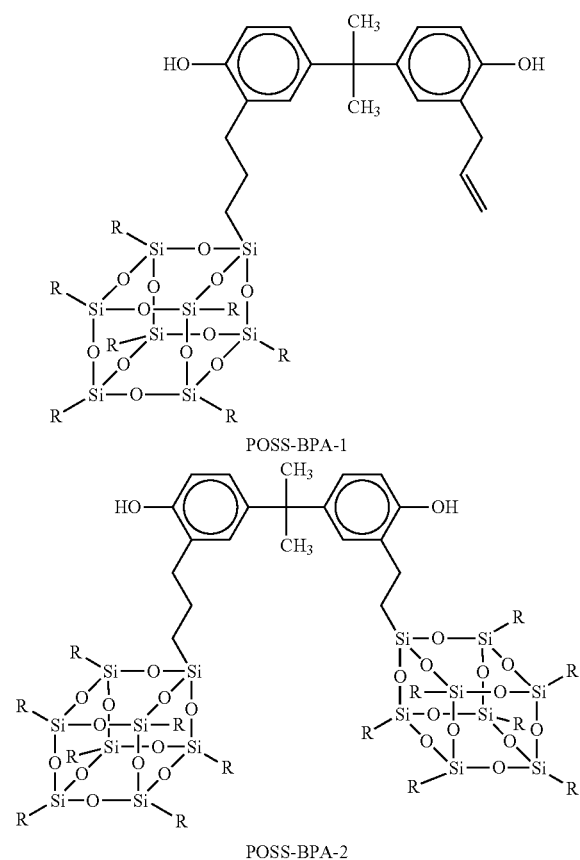

POSS-BPA-1

POSS-BPA-2 wherein R is selected from the group consisting of alkyl, cycloalkyl, phenyl, aryl, alkoxy, halogen, and hydrogen. The R may be substituted and may be linear or branched. The POSS side groups possess structural and electronic properties similar to silica and silicone and can be conceptually thought of as nanoparticles. Because they are bulky and silicone-like, the POSS side groups, when incorporated into the dielectric layer, readily rise and provide a hydrophobic surface to the dielectric layer. This facilitates preferential interfacial interactions between the dielectric layer and the semiconductor layer.

In other specific embodiments, the compound has the structure of Formula (I):

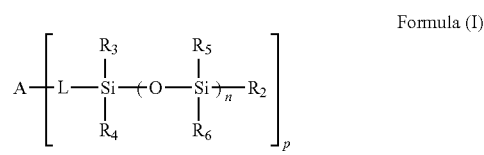

Formula (I)

wherein A contains at least one phenol group; L is a divalent linkage; $R_2$, $R_3$, $R_4$, $R_5$, and $R_6$ are independently selected from the group consisting of hydrogen and alkyl; n is an integer; and p is an integer from 1 to 10. In specific embodiments, n is a positive integer (i.e. not zero). In further specific embodiments, when an R group is alkyl, it may have from 1 to 5 carbon atoms and be linear or branched. Exemplary alkyl groups include methyl, ethyl, propyl, and butyl. In specific embodiments, $R_3$, $R_4$, $R_5$, and $R_6$ are methyl. Embodiments of Formula (I) comprise a polysiloxane as the group containing silicon. As with the POSS group, the polysiloxane group provides a hydrophobic surface on the dielectric layer.

Four further exemplary embodiments of Formula (I) are shown below:

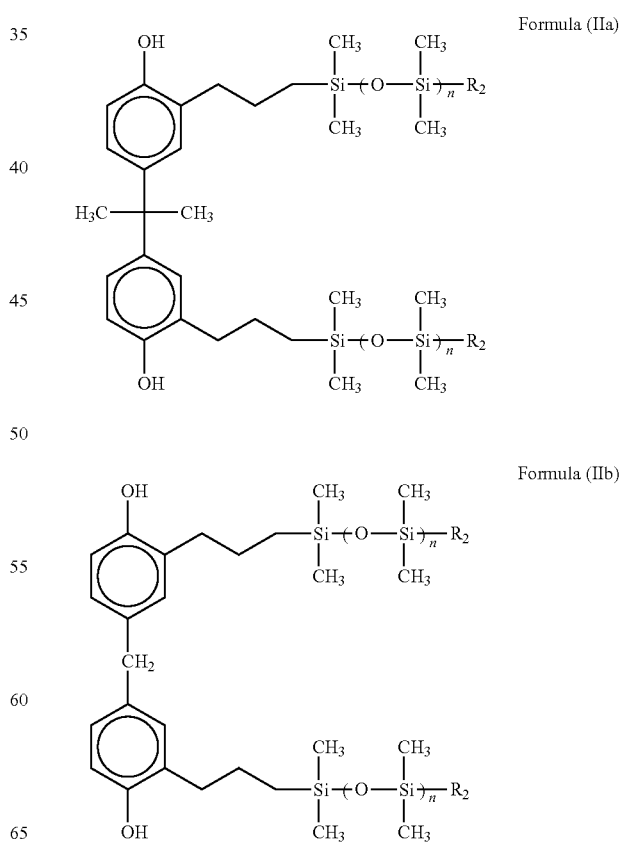

Formula (IIa)

Formula (IIb)

Formula (IIc)

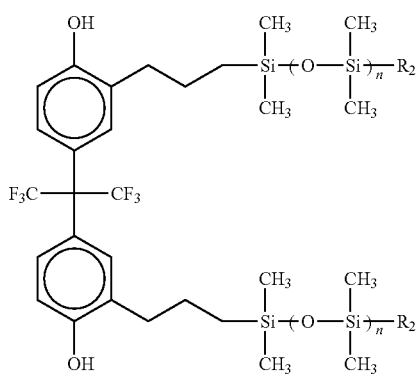

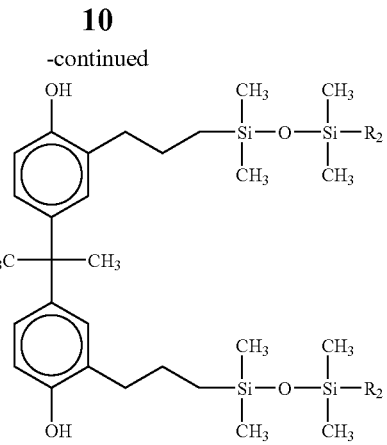

wherein $R_1$ and $R_2$ can be independently hydrogen or alkyl.

Generally, the allyl groups of the diallyl-bisphenol will react with the hydrogen-containing silicon atom of the polysiloxane hydride. Thus, if, for example, $R_1$ is hydrogen and $R_2$ is alkyl, the result is a bisphenol with a polysiloxane pendant group, such as those shown in Formulas (IIa), (IIb), (IIc), or (IId).

However, if both $R_1$ and $R_2$ are hydrogen, then the polysiloxane hydride may be polymerized with the diallyl-bisphenol to form a copolymer. The copolymer has the general structure of Formula (III) shown below:

Formula (IId)

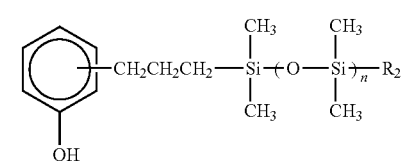

wherein $R_2$ is hydrogen or alkyl; and n is an integer from 0 to 10,000. Again, in further specific embodiments n is a positive integer (i.e. not zero). As is clear from these exemplary embodiments, A may be a bisphenolic compound.

Compounds of Formula (I) can be prepared by the hydrosilation of a diallyl-bisphenol with a polysiloxane hydride. Because the length of the polysiloxane group can be adjusted, the properties of the dielectric layer can also be tuned for optimum performance. Generally, the diallyl-bisphenol and polysiloxane hydride are reacted in the presence of a Karstedt catalyst, as seen in Reaction (I) below:

Formula (III)

$$\left[ \left( \begin{array}{c} R_5 \\ | \\ Si-O \\ | \\ R_6 \end{array} \right)_n \begin{array}{c} R_3 \\ | \\ Si-L-A-L \\ | \\ R_4 \end{array} \right]_m$$

wherein A contains at least one phenol group; L is a divalent linkage; $R_3$, $R_4$, $R_5$, and $R_6$ are independently selected from the group consisting of hydrogen and alkyl; n is an integer; and m is the degree of polymerization. The integer n may be zero or a positive integer.

A specific example of a copolymer of Formula (III) is shown in Reaction (II) shown below, which produces the copolymer of Formula (IV):

Reaction (I)

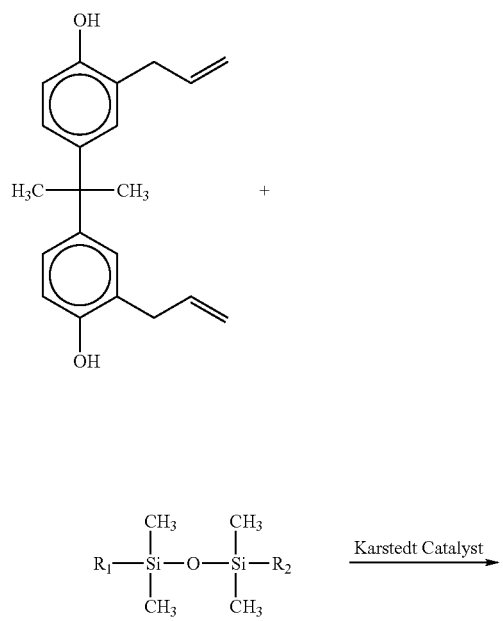

Reaction (II)

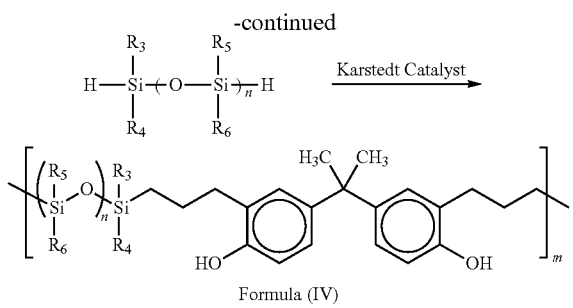

Formula (IV)

wherein n is an integer; and m is the degree of polymerization. The product of Reaction (II) may be abbreviated as "DMS-co-BPA". The reaction kinetics are such that hydrosilation (reaction of the allyl groups with the siloxane hydride) is preferred over other reactions. Thus, two siloxane hydrides do not react with each other and the phenol groups do not reach with the siloxane hydride.

The composition used to form the dielectric layer may further comprise poly(vinylphenol) ("PVP") or a melamine-formaldehyde resin ("MF resin"). In specific embodiments, the composition further comprises both PVP and an MF resin. Upon thermal curing, the PVP, MF resin, and the compound form a crosslinked network. The phenol group of the compound allows the side group to be covalently bonded onto the dielectric surface. The PVP and MF resin together form a layer that is free of pinholes and the compound provides a surface that achieves a preferential molecular organization with respect to the semiconductor layer, resulting in high mobility.

The composition from which the dielectric layer is formed may further comprise an acid catalyst. The acid catalyst accelerates the curing process. An exemplary acid catalyst is p-toluenesulfonic acid.

The composition from which the dielectric layer is formed may contain a solvent. The solvent may be an organic solvent, such as 1-butanol and chlorobenzene.

The PVP and MF resin are usually present in the composition or the dried dielectric layer in about a 1:1 ratio by weight. The PVP and MF resin may each be present in the amount of from about 1 to about 90 weight percent, based on the weight of the dried dielectric layer. The compound having at least one phenol group and at least one silicon-containing group is present in the amount of from about 0.1 to about 20 weight percent, based on the weight of the dried dielectric layer. The acid catalyst, when used, is present in small amounts compared to the PVP, MF resin, and compound.

In some specific embodiments, the PVP and MF resin are each be present in the amount of from about 40 to about 45 weight percent, based on the weight of the dried dielectric layer. The compound having at least one phenol group and at least one silicon-containing group is present in the amount of from about 10 to about 20 weight percent, based on the weight of the dried dielectric layer.

The dielectric layer of the present disclosure has a dielectric constant greater than about 3.5. In further embodiments, the dielectric constant is greater than about 4.0, and in further specific embodiments the dielectric constant is greater than about 5.0.

The dielectric layer may be any thickness suitable for use in an electronic device, such as a thin film transistor. In embodiments, the dielectric layer has a thickness of from about 50 nanometers to about 5 micrometers. In other embodiments the dielectric layer has a thickness of from about 200 nanometers to about 1 micrometer.

The dielectric layer of the present disclosure has a very smooth surface. The surface roughness of the dielectric layer is less than about 50 nanometers in some embodiments, 10 nanometers in further embodiments, and less than about 1 nanometer in still further embodiments.

The dielectric layer of the present disclosure has a hydrophobic surface. The surface properties can be characterized, for example, by measuring the advancing water contact angle of the surface. In embodiment, the dielectric layer has an advancing surface water contact angle larger than about 85 degrees. In further embodiments, the advancing surface water contact angle is larger than about 95 degrees. In further embodiments, the advancing surface water contact angle is larger than about 100 degrees.

The dielectric layer can be applied using known methods. It is generally applied via liquid deposition such as spin-on coating, dip coating, blade coating, rod coating, screen printing, stamping, ink jet printing, and the like, from a solution as described herein. After the liquid deposition, the dielectric layer is cured at a plastic-compatible temperature, for example less than about 200° C., or less than about 180° C. to form a robust crosslinked dielectric layer.

As previously mentioned, TFTs generally comprise a supporting substrate, three electrically conductive electrodes (gate, source and drain electrodes), a channel semiconductor layer, and an electrically insulating gate dielectric layer separating the gate electrode from the semiconductor layer. The other layers and their composition/manufacture are discussed below.

The substrate in the electronic device of the present disclosure may be any suitable material including, but not limited to, silicon wafer, glass plate, a plastic film or sheet, and the like depending on the intended application. Other suitable materials include ceramic foils, coated metallic foils, acrylics, epoxies, polyamides, polycarbonates, polyimides, and polyketones. For structurally flexible electronic devices, a plastic substrate, such as, for example, polyester, polycarbonate, polyimide sheets, and the like, may be used. The thickness of the substrate may be from about 10 micrometers to over 10 millimeters, provided the required mechanical properties are satisfied for the intended application. In embodiments, the substrate is from about 50 to about 100 micrometers. In embodiments with rigid substrates, such as glass or silicon, the substrate is from about 1 to about 10 millimeters.

The gate electrode is composed of an electrically conductive material. It can be a thin metal film, a conducting polymer film, a conducting film made from conducting ink or paste or the substrate itself, for example heavily doped silicon. Examples of gate electrode materials include, but are not restricted to, aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The semiconductor layer generally is an organic semiconducting material. Examples of organic semiconductors include, but are not limited to, acenes, such as anthracene, tetracene, pentacene, and their substituted derivatives, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives. In one exemplary embodiment, the semiconductor used is a p-type semiconductor. In another exemplary embodiment, the semiconductor is a liquid crystalline semiconductor. In another preferred embodiment, the semiconductor polymers are for examples polythiophene, triarylamine polymers, polyindolocarbazoles, and the like. Polythiophenes include, for example, both regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, and polythiophenes comprising non-thiophene based aromatic groups such as phenylene, fluorene, furan, and the like. The semiconductor layer is from about 5 nm to about 1000 nm thick. The semiconductor layer can be formed by molecular beam deposition, vacuum evaporation, sublimation, spin-on coating, dip coating, blade coating, rod coating, screen printing, stamping, ink jet printing, and the like, and other conventional processes known in the art, including those processes described in forming the gate electrode.

Typical materials suitable for use as source and drain electrodes include those of the gate electrode materials such as gold, nickel, aluminum, platinum, conducting polymers, and conducting inks. In embodiments, the conductive material provides low contact resistance to the semiconductor. Typical thicknesses are about, for example, from about 40 nanometers to about 1 micrometer with a more specific thickness being about 100 to about 400 nanometers. The TFTs of the present disclosure contain a semiconductor channel. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts, is applied to the drain electrode to collect the charge carriers transported across the semiconductor channel when a voltage of, for example, about +10 volts to about −80 volts, is applied to the gate electrode. The electrodes may be formed or deposited using conventional processes known in the art.

The various components of the TFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconductor layer should both be in contact with the dielectric layer. In addition, the source and drain electrodes should both be in contact with the semiconductor layer.

The resulting TFT may have a mobility of greater than 0.01 $cm^2/V \cdot sec$ and a current on/off ratio of greater than $10^4$. In some specific embodiments, the mobility is greater than 1.0 $cm^2/V \cdot sec$.

The following examples illustrate TFTs made according to the methods of the present disclosure. The examples are merely illustrative and are not intended to limit the present disclosure with regard to the materials, conditions, or process parameters set forth therein. All parts are percentages by volume unless otherwise indicated.

The present disclosure will further be illustrated in the following non-limiting working examples, it being understood that these examples are intended to be illustrative only and that the disclosure is not intended to be limited to the materials, conditions, process parameters and the like recited herein. All proportions are by weight unless otherwise indicated.

EXAMPLES

Example 1

Bisphenol A with POSS Pendant Groups

A coating solution was prepared by mixing 45 weight percent ("wt %") PVP, 45 wt % melamine-formaldehyde resin, 10 wt % POSS-BPA-1 purchased from Hybrid Plastics where R is methyl, and an acid catalyst in 1-butanol/chlorobenzene (4:1 weight ratio). The solution was then filtered with a 0.45 micron syringe filter.

A thin film transistor was built on an aluminum-coated polyethylene terephthalate (PET) substrate, which also acted as the gate electrode. The coating solution was spin coated at 2000 rpm onto the substrate for 60 seconds, then annealed at 150° C. for 5 minutes to promote crosslinking. Vacuum evaporated gold was used for the source/drain electrodes. The polythiophene PQT-12, as disclosed in B. Ong et al, *J. Am. Chem. Soc.*, 2004, 126(11):3378-79, was used as the semiconductor layer.

Example 2

Bisphenol A with Polysiloxane Pendant Groups

Two coating solutions were prepared by mixing 40 wt % PVP, 40 wt % melamine-formaldehyde resin, 20 wt % bisphenol A with polysiloxane pendant groups, and p-toluenesulfonic acid as acid catalyst in 1-butanol. The solution was then filtered with a 0.45 micron syringe filter. Two bisphenol A compounds were used, which had different polysiloxane pendant groups and thus differing molecular weights.

Two thin film transistors were built as in Example 1 using the coating solutions described above. Example 2A used the bisphenol A compound having a higher molecular weight than that of Example 2B.

Example 3

Bisphenol A Polysiloxane Copolymer

A coating solution was prepared by mixing 40 wt % PVP, 40 wt % melamine-formaldehyde resin, and 20 wt % DMS-co-BPA (Formula (IV)), and acid catalyst in 1-butanol. The solution was then filtered with a 0.45 micron syringe filter.

A thin film transistor was built as in Example 1 using the coating solution as described in Example 3.

Results

The thin film transistors of Examples 1, 2, and 3 were tested for their surface properties and their electrical performance. The results are shown in Table 1 below:

TABLE 1

Properties of Thin Film Transistor Examples

| Example | Water Contact Angle | Capacitance (nF/cm$^2$) | Mobility (cm$^2$/V·sec) | Current on/off Ratio |
|---|---|---|---|---|
| 1  | 99-103° | 7.5 | 0.01-0.02    | 10$^4$-10$^5$ |
| 2A | 89-97°  | 6.0 | 0.009-0.013  | 10$^4$-10$^5$ |
| 2B | 88-95°  | 4.2 | 0.01-0.018   | 10$^4$-10$^5$ |
| 3  | 89-95°  | 4.2 | 0.01-0.02    | 10$^4$-10$^5$ |

The results showed that the dielectric layers of the present disclosure have a hydrophobic surface, as shown by the large water contact angles. They had good mobility and current on/off ratio; these properties are about one magnitude higher than a dielectric layer consisting of PVP only.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An electronic device having a dielectric layer prepared from a composition comprising a mixture of:
   poly(vinylphenol);
   a melamine-formaldehyde resin; and
   a compound having at least one phenol group and at least one group comprising silicon;
   wherein the compound has one of the following structures:

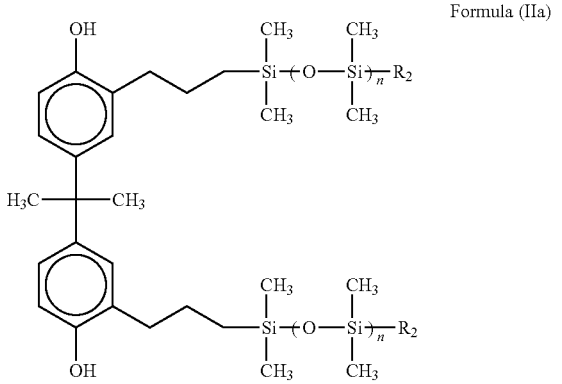

wherein R$_2$ is alkyl; and n is an integer from 0 to 10,000.

2. The electronic device of claim 1, wherein the dielectric layer is crosslinked.

3. The electronic device of claim 1, wherein the composition further comprises an acid catalyst.

4. The electronic device of claim 3, wherein the acid catalyst is p-toluenesulfonic acid.

5. The electronic device of claim 1, wherein the compound is present in the dielectric layer in an amount of from about 0.1 to about 20 wt %.

6. The electronic device of claim 1, wherein the compound is present in the dielectric layer in an amount of from about 10 to about 20 wt %.

7. The electronic device of claim 1, wherein the dielectric layer has a hydrophobic surface having an advancing surface water contact angle of greater than about 85°.

8. The electronic device of claim 1, wherein the dielectric layer has a hydrophobic surface having an advancing surface water contact angle of greater than about 95°.

* * * * *